United States Patent
Schuster (10) Patent No.: US 7,315,454 B2
(45) Date of Patent: Jan. 1, 2008

(54) SEMICONDUCTOR MEMORY MODULE (75) Inventor: Josef Schuster, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/439,443

(22) Filed: May 24, 2006

(65) Prior Publication Data
US 2007/0096302 A1 May 3, 2007

(30) Foreign Application Priority Data
Oct. 31, 2005 (DE) .................. 10 2005 051 998

(51) Int. Cl.
H05K 7/02 (2006.01)

(52) U.S. Cl. .............. 361/736; 361/760; 361/748; 174/260; 29/834; 365/63; 257/723

(58) Field of Classification Search .......... 361/720, 361/722, 723, 737, 736, 748, 760, 764, 783; 174/260; 365/63; 257/723, 724, 778, 698, 257/700, 686; 29/832, 834–836
See application file for complete search history.

(56) References Cited

U.S. PATENT DOCUMENTS

| | | | |
|---|---|---|---|
| 4,885,841 A * | 12/1989 | McNabb ...................... 29/834 |
| 5,974,331 A * | 10/1999 | Cook et al. ................. 455/461 |
| 5,982,654 A * | 11/1999 | Corisis ........................ 365/63 |
| 6,160,718 A * | 12/2000 | Vakilian ..................... 361/803 |
| 6,169,325 B1 * | 1/2001 | Azuma et al. ............. 257/685 |
| 6,181,004 B1 * | 1/2001 | Koontz et al. ............. 257/691 |
| 6,222,739 B1 * | 4/2001 | Bhakta et al. ............. 361/790 |
| 6,266,265 B1 * | 7/2001 | Sakuragi ..................... 365/63 |
| 6,301,141 B1 * | 10/2001 | Morgan et al. ............. 365/51 |
| 6,320,779 B1 * | 11/2001 | Morgan et al. ............. 365/51 |
| 6,327,127 B1 * | 12/2001 | Utsunomiya et al. ........ 361/92 |
| 6,353,539 B1 * | 3/2002 | Horine et al. .............. 361/736 |
| 6,430,075 B2 * | 8/2002 | Morgan et al. ............. 365/51 |
| 6,502,161 B1 * | 12/2002 | Perego et al. .................. 711/5 |
| 6,850,414 B2 * | 2/2005 | Benisek et al. ............ 361/748 |
| 6,873,534 B2 * | 3/2005 | Bhakta et al. ............... 365/63 |
| 6,891,729 B2 * | 5/2005 | Ko et al. ..................... 361/736 |
| 6,930,900 B2 * | 8/2005 | Bhakta et al. .............. 365/51 |
| 2002/0006032 A1 * | 1/2002 | Karabatsos ................. 361/760 |
| 2002/0196612 A1 | 12/2002 | Gall et al. |
| 2007/0091704 A1 * | 4/2007 | RaghuRam et al. ........ 365/218 |

* cited by examiner

Primary Examiner—Dean A. Reichard
Assistant Examiner—Dameon E. Levi
(74) Attorney, Agent, or Firm—Edell, Shapiro & Finnan, LLC (57) ABSTRACT A semiconductor memory module includes an electronic printed circuit board with a contact strip and a plurality of semiconductor memory chips of identical type that are mounted on at least one external area of the printed circuit board. The semiconductor memory chips are rectangular in shape and are arranged, in at least two rows with the adjacent chips being oriented perpendicular to one another, such that the area used on the PC board is optimized.

7 Claims, 8 Drawing Sheets

SEMICONDUCTOR MEMORY MODULE

CROSS REFERENCE TO RELATED APPLICATIONS

This application claims priority under 35 USC §119 to German Application No. DE 10 2005 051 998.9, filed on Oct. 31, 2005, and titled "Semiconductor Memory Module," the entire contents of which is hereby incorporated by reference.

FIELD OF THE INVENTION

The present invention relates to production of semiconductor components and more particularly to a semiconductor memory module having an electronic printed circuit board and a plurality of semiconductor memory chips of identical type that are mounted on the printed circuit board.

BACKGROUND

In modern semiconductor memory modules, a plurality of semiconductor memory chips, for example Dynamic Random Access Memories (DRAMs), are mounted on an electronic printed circuit board, which semiconductor memory chips can be operated in parallel and can simultaneously receive electrical signals. In this case, the electronic printed circuit board serves for distributing the electronic signals and may itself be connected to a superordinate electronic unit via a contact strip provided with contact terminals. To distribute the electronic signals and to read out data, the printed circuit board is provided with conductor tracks which may run in a plurality of planes within the printed circuit board.

Due to the rising demand for memory performance, it is desired to mount an increasing number of semiconductor memory chips on an individual semiconductor memory module without increasing the area of the module or of the electronic printed circuit board in the process. Moreover, the line tracks are desired to be as short as possible to keep the signal propagation times as short as possible.

Semiconductor memory modules are typically equipped such that the semiconductor memory chips are arranged symmetrically with respect to the center of the semiconductor memory module. By way of example, between the center and an edge of the semiconductor memory module that runs perpendicularly to the contact strip, at least eight semiconductor memory chips of identical type are mounted next to one another in two rows. In this case, only eight of the semiconductor memory chips serve for storing data, while one semiconductor memory chip serves as an error correction memory chip which compares the signals of the other eight semiconductor memory chips to avoid errors during storage and read-out.

Modern semiconductor memory chips have a square or rectangular form. It generally holds true that the dimensions of the semiconductor memory chips scale with the storage capacity. In particular, modern semiconductor memory chips with a particularly large storage capacity have comparatively large dimensions.

The problem arises that the electronic printed circuit boards for semiconductor memory modules in industrial series production have a standard size, in the case of rectangular memory chips with a large storage capacity, e.g., DDR3-DRAM memory chips, can no longer be arranged in two rows, lying one above another.

Moreover, when arranging the memory chips, care must be taken to ensure that an arrangement is found which exhibits the occurrence of signal propagation times that are as uniform as possible to all of the semiconductor memory chips in conjunction with conductor track lengths that are, to the greatest extent possible, identical in length. Meanwhile, the conductor track lengths are also desired to be as short as possible to keep the signal propagation times as short as possible.

Accordingly, it would be desirable to have a semiconductor memory module that can be equipped with comparatively large rectangular semiconductor memory chips, e.g., DDR3-DRAM memory chips, in two rows lying one above another, with the conductor tracks to the respective semiconductor memory chips being identical in length and as short as possible.

SUMMARY

A semiconductor memory module having an electronic printed circuit board and a plurality of semiconductor memory chips of identical type which are mounted on at least one external area of the printed circuit board is shown and described according to the invention. The printed circuit board has a contact strip that runs at a first edge of the printed circuit board along a first lateral direction (x) and is provided with a plurality of electrical contacts lined up along the first lateral direction (x). The electrical printed circuit board extends along the first lateral direction (x) between two second edges, which usually run in a second lateral direction (y), which is perpendicular to the first lateral direction (x).

Between the center of the printed circuit board and the two second edges of the printed circuit board, at least two adjacent rows of semiconductor chips of identical type are arranged in a manner lying one above another in the second lateral direction (y). In each of the two rows, the semiconductor memory chips of identical type are mounted next to one another along the first lateral direction (x) on the external area of the printed circuit board. The semiconductor memory chips of the two adjacent rows are respectively arranged in an opposite position.

The semiconductor memory chips of identical type have a rectangular form, which is composed of a smaller dimension and a larger dimension, the larger dimension extending in the direction perpendicular to the smaller dimension.

Furthermore, the semiconductor memory chips of identical type in one and the other of the at least two adjacent rows are oriented with their smaller or larger dimensions parallel to the contact strip, the semiconductor memory chips being arranged in an alternate sequence of different dimensions. In other words, within such an arrangement of rows of semiconductor memory chips, a smaller dimension is followed by a larger dimension and a larger dimension is followed by a smaller dimension. To put it in yet another way, successive semiconductor memory chips in a row are in each case rotated by 90° relative to one another.

Furthermore, the semiconductor memory chips are arranged such that one semiconductor memory chip of two semiconductor memory chips of identical type that are arranged in an opposite position in the second lateral direction (y) in the two rows is oriented with its shorter dimension parallel to the contact strip, while the other semiconductor memory chip of these two semiconductor memory chips is oriented with its longer dimension parallel to the contact strip. In this respect, the dimensions of the semiconductor memory chips that are parallel to the second lateral direction (y) alternate in terms of their magnitude in the second lateral direction (y).

According to an exemplary embodiment of the invention, the arrangement chosen for the semiconductor memory chips makes it possible to achieve an optimum space utilization of the entire usable area of the electronic printed circuit board, so that rectangular semiconductor memory chips having larger dimensioning than in the case of a symmetrical arrangement (in which all the semiconductor memory chips have the same orientation) of rectangular semiconductor memory chips can be mounted onto the electronic printed circuit board. In particular, it is possible to mount rectangular semiconductor memory chips onto the electronic printed circuit board whose larger dimension would not permit a symmetrical two-row arrangement of the semiconductor memory chips, in the case of which the semiconductor memory chips are rotated by 0° or 180° relative to one another, between the center and a respective second edge of the electronic printed circuit board.

In an advantageous manner, at least four semiconductor memory chips of identical type are mounted in a row on the external area of the electrical printed circuit board. In particular, here at least eight semiconductor memory chips of identical type, distributed between two rows arranged in a manner lying one above another in the second lateral direction (y), are mounted on the external area of the electronic printed circuit board.

In one advantageous refinement of the semiconductor memory module according to the invention, the semiconductor memory chips of identical type that are mounted on the external area of the electrical printed circuit board between the center of the printed circuit board and the respective second edge of the printed circuit board are connected by a line bus branching once. In this case, the semiconductor memory chips of one row of the at least two adjacent rows of semiconductor memory chips of identical type are connected one after another to the line tracks of one branch of the line bus, while the semiconductor memory chips of the other row of the at least two adjacent rows of semiconductor memory chips of identical type are connected one after another to the line tracks of the other branch of the line bus.

In a further advantageous refinement of the semiconductor memory module according to the invention, the semiconductor memory chips of identical type that are mounted on the external area of the electrical printed circuit board between the center of the printed circuit board and the respective second edge of the printed circuit board are connected by a line bus, the semiconductor memory chips of one row of the at least two adjacent rows of semiconductor memory chips of identical type being connected one after another to the line tracks of the line bus and the semiconductor memory chips of the other row of the at least two adjacent rows of semiconductor memory chips of identical type being connected one after another to the line tracks of the line bus.

In a further advantageous refinement of the semiconductor memory module according to the invention, the semiconductor memory chips of identical type that are mounted on the external area of the electrical printed circuit board between the center of the printed circuit board and the respective second edge of the printed circuit board are connected by a line bus, on the one hand semiconductor memory chips that are situated oppositely in the second lateral direction (y) and on the other hand semiconductor memory chips that are adjacent in a row being connected alternately to the line tracks of the line bus.

The semiconductor memory module according to the invention is advantageously a DIMM module standardized according to the JEDEC (Joint Electron Device Engineering Council) Standard (JEDEC Solid State Technology Association).

BRIEF DESCRIPTION OF THE DRAWINGS

The invention will now be explained in more detail on the basis of exemplary embodiments, reference being made to the accompanying drawings, in which.

DETAILED DESCRIPTION

Identical elements are designated by identical reference numerals in the figures.

Figure 1A:
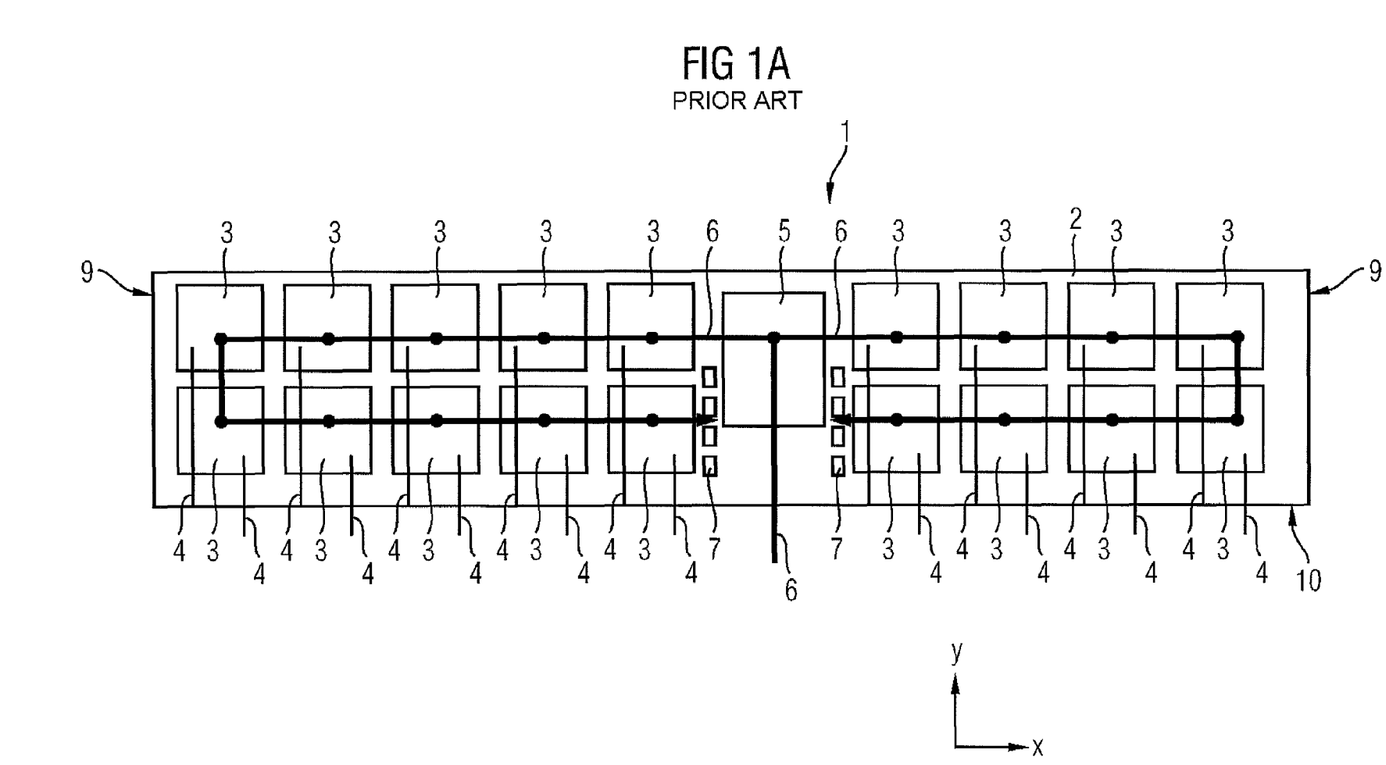
FIGS. 1A and 1B show a schematic plan view of a front side (FIG. 1A) and a rear side (FIG. 1B) of a conventional memory module.
Figure 1B:
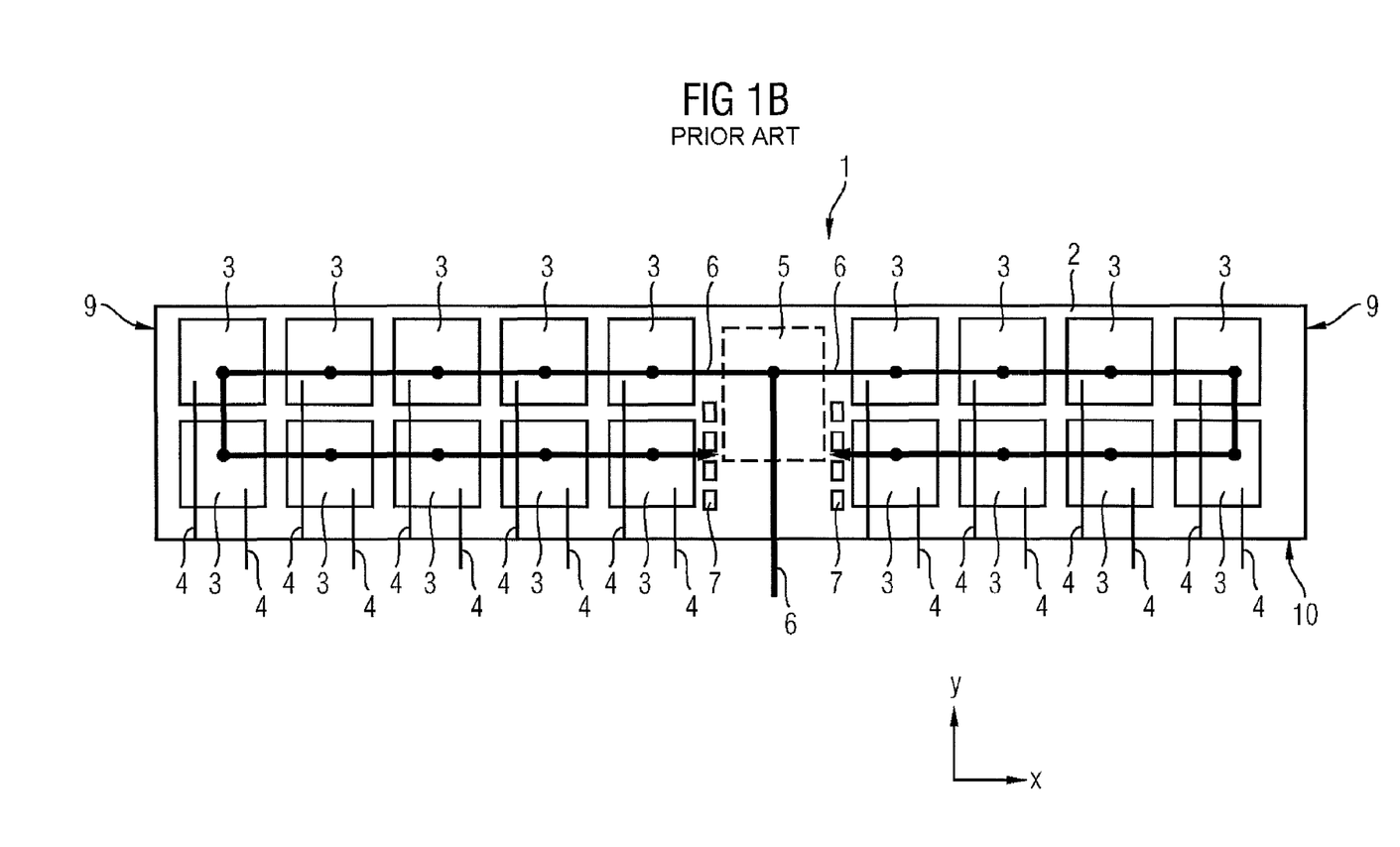

First, reference is made to FIGS. 1A and 1B which illustrate a schematic plan view of a front side (FIG. 1A) and a rear side (FIG. 1B) of a conventional memory module. Such a memory module, which is designated in its entirety by the reference numeral 1, comprises an electronic printed circuit board 2 with semiconductor memory chips 3 of identical type, e.g., DRAM memory chips, mounted on the front and back external areas of the printed circuit board. The electrical printed circuit board 2 extends along a first lateral direction (x) between two second edges 9 which run in a second lateral direction (y) which is perpendicular to the first lateral direction (x). The square-shaped semiconductor memory chips 3 are arranged in a manner lying one above another in the second lateral direction (y) in two adjacent rows in each case between the center (relative to the first lateral direction (x)) of the printed circuit board and the two second edges 9 of the printed circuit board. In each of the two rows, the semiconductor memory chips 3 of identical type are mounted next to one another along the first lateral direction (x) on the external area of the printed circuit board, wherein the semiconductor memory chips 3 of the two adjacent rows are respectively arranged in an opposite position. A register component 5 which is different from the semiconductor memory chips 3 is arranged in the center of the electronic printed circuit board 2. A line bus 6, i.e., control and address bus, enters into the register component 5 from outside, splits up and makes contact with each individual of the semiconductor memory chips 3 in turn in a forward loop until it leads into a termination 7, which serves for avoiding undesirable signal reflections. From each semiconductor memory chip 3 proceeds a data line 4, for reading out the stored data that joins a contact strip that is not specifically illustrated in FIG. 1. The contact strip is arranged at a first edge 10 of the electronic printed circuit board 2, wherein the first edge is parallel to the first lateral direction (x) and is provided with a plurality of electrical contacts disposed along the first lateral direction (x). The contact strip may be plugged into a superordinate electronic unit, e.g., a motherboard.

Figure 2:
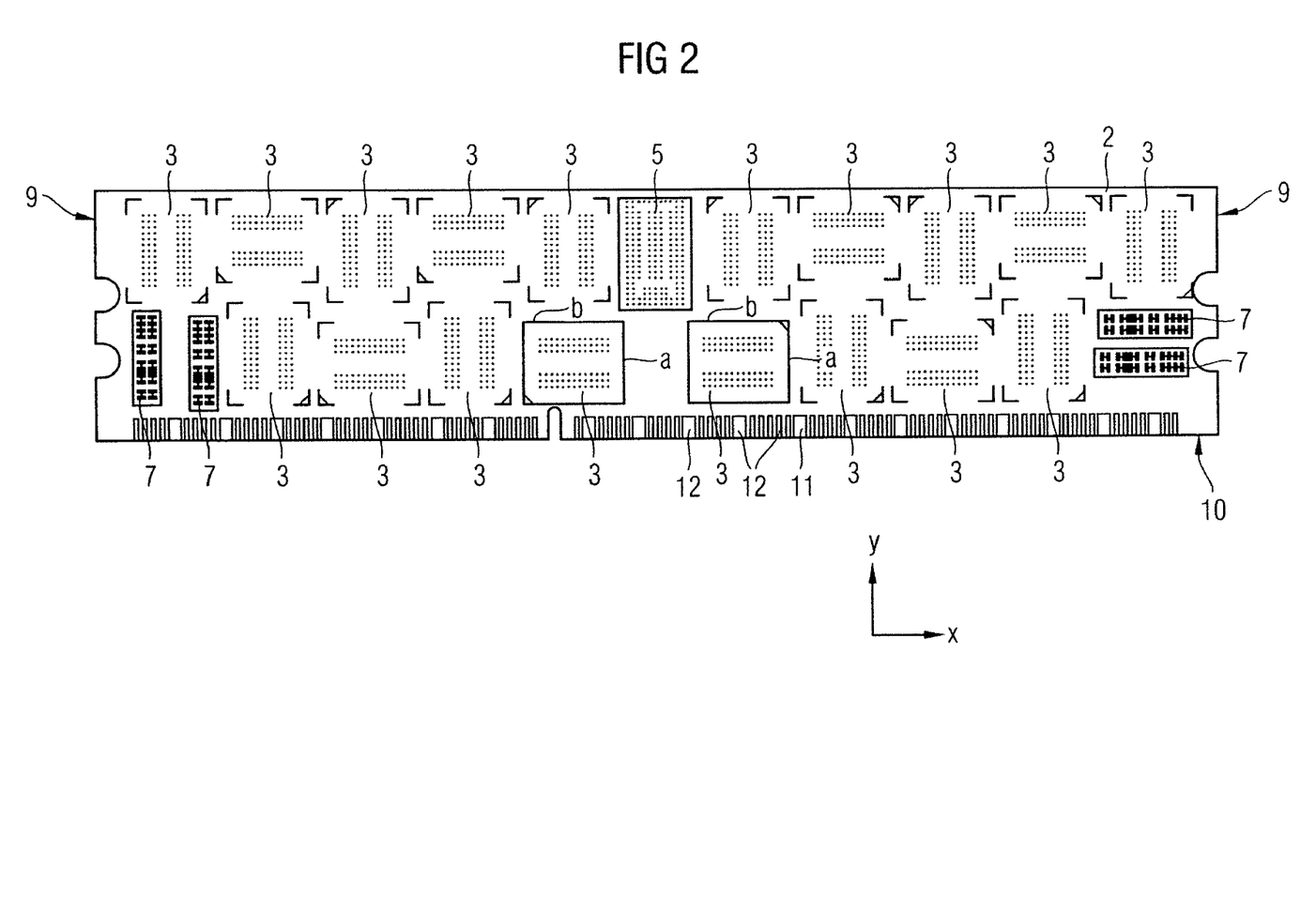
FIG. 2 shows a schematic plan view of one embodiment of the memory module according to an exemplary embodiment of the invention.
Figure 3:
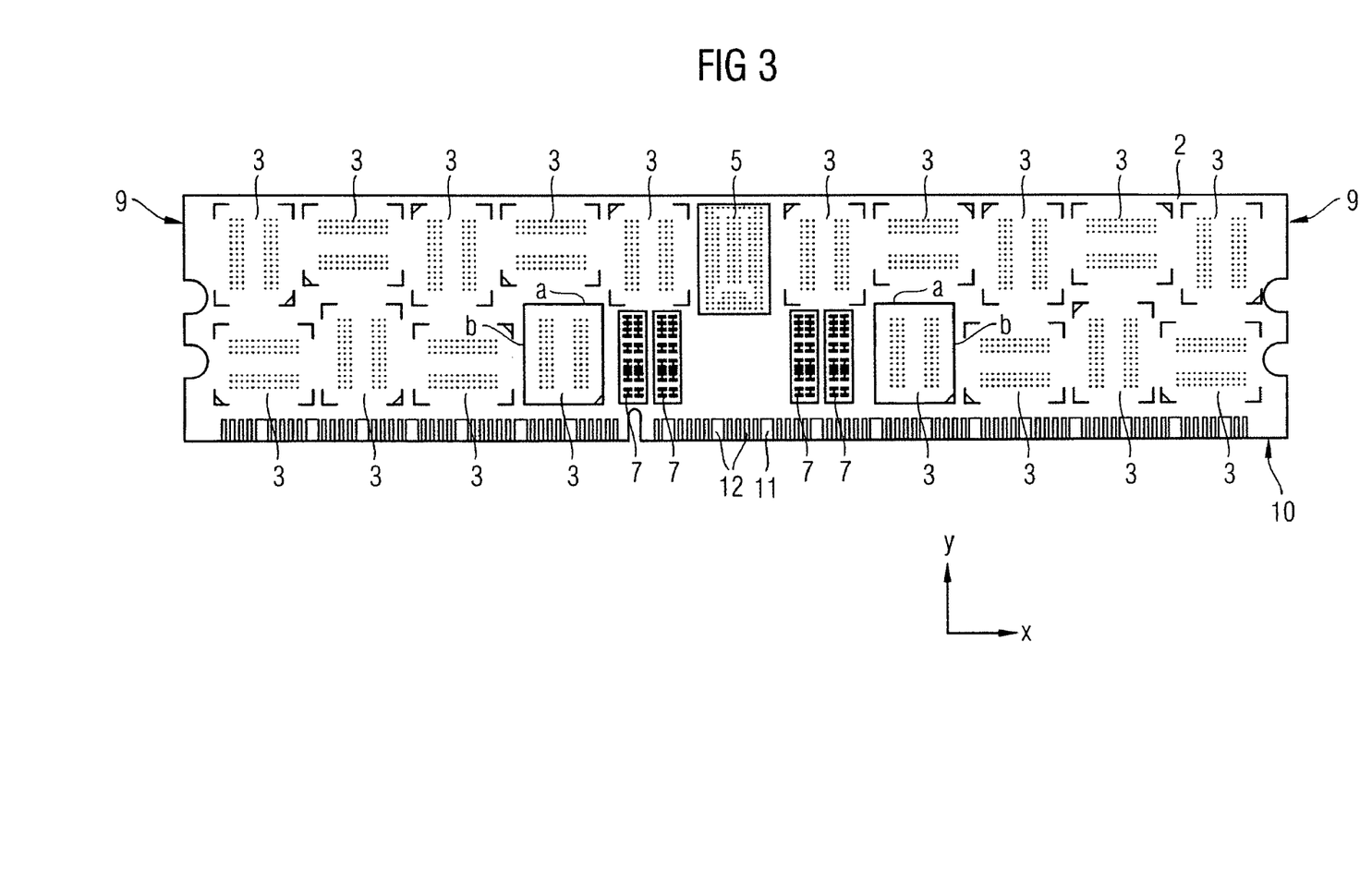
FIG. 3 shows a schematic plan view of a further embodiment of the memory module according to the invention.
Figure 4:
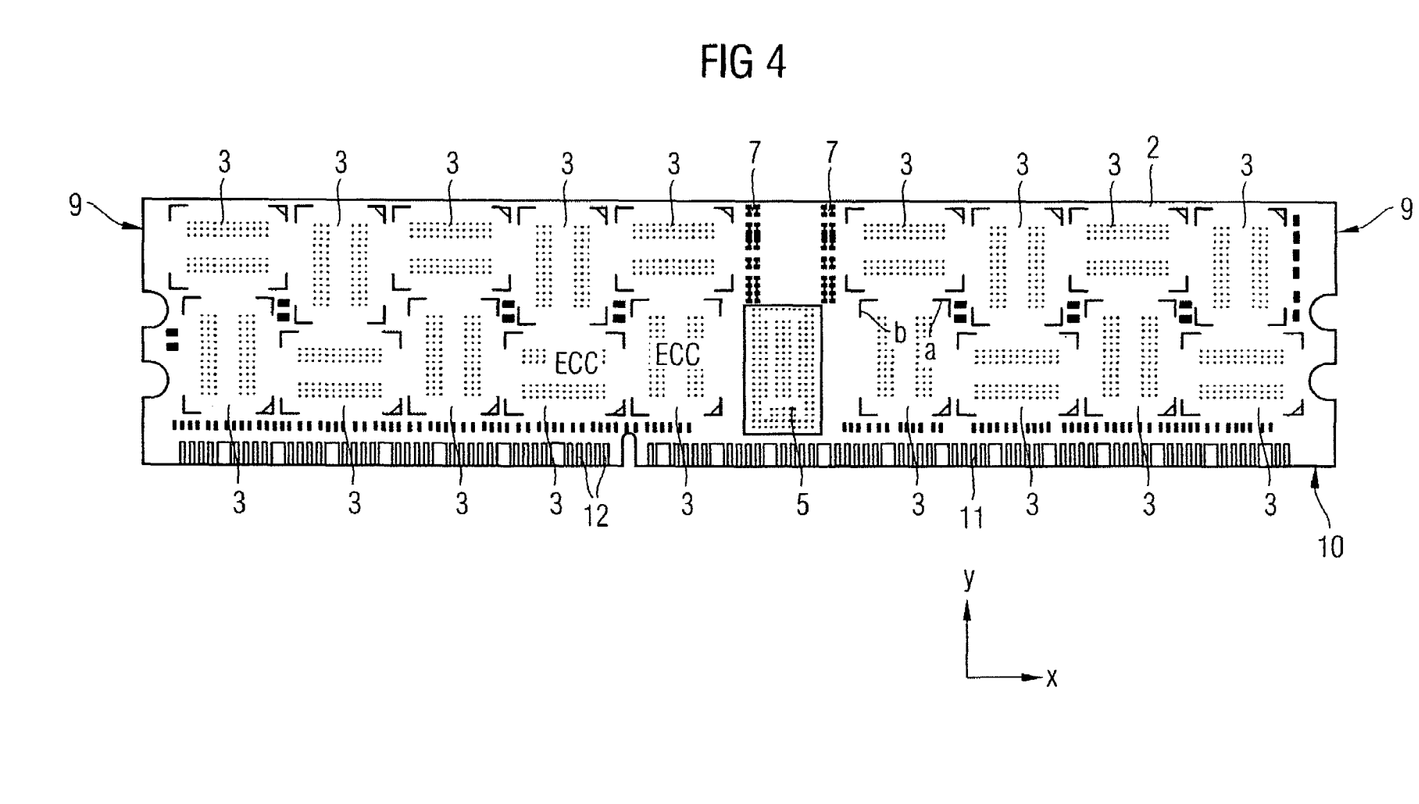
FIG. 4 shows a schematic plan view of a further embodiment of the memory module according to the invention.

FIGS. 2 to 4 illustrate schematic plan views of embodiments of the memory module according to the invention. A common aspect of the respective embodiments is that a memory module according to the invention comprises an electronic printed circuit board 2 with semiconductor memory chips 3 of identical type, e.g., DDR3-DRAM memory chips, mounted on the front and back external areas of the printed circuit board. The electrical printed circuit board 2 extends along a first lateral direction (x) between two second edges 9 that run in a second lateral direction (y) that is perpendicular to the first lateral direction (x). The rectangular shaped semiconductor memory chips 3 are arranged in a manner lying one above another in the second lateral direction (y) in two adjacent rows in each case between the center, relative to the first lateral direction (x) of the printed circuit board and the two second edges 9 of the printed circuit board. In each of the two rows, the semiconductor memory chips 3 of identical type are mounted next to one another along the first lateral direction (x) on the external area of the printed circuit board, wherein the semiconductor memory chips 3 of the two adjacent rows are respectively arranged in an opposite position. A register component 5 which is different from the semiconductor memory chips 3 is arranged in the center of the electronic printed circuit board 2. From each semiconductor memory chip proceeds a data line 4, for reading out the stored data, which joins a contact strip 11. The contact strip 11, which is arranged at a first edge 10 of the electronic printed circuit board 2 and wherein the first edge is parallel to the first lateral direction (x), is provided with a multiplicity of electrical contacts 12 disposed along the first lateral direction (x). The contact strip may be plugged into a superordinate electronic unit, e.g., a motherboard.

The semiconductor memory chips 3 of identical type have a rectangular shape comprising a smaller (shorter) dimension a and a larger (longer) dimension b, the larger dimension b extending in the direction perpendicular to the smaller dimension a. The semiconductor memory chips of identical type, in the two adjacent rows on an external area of the electronic printed circuit board 2, are oriented with their smaller or larger dimensions parallel to the contact strip 11. In particular, within such an arrangement of rows of semiconductor memory chips, a smaller dimension a is followed by a larger dimension b and a larger dimension b is followed by a smaller dimension a. Consequently, successive semiconductor memory chips 3 of a row are rotated in each case by 90° relative to one another. Furthermore, the semiconductor memory chips 3 are arranged such that one semiconductor memory chip of two semiconductor memory chips of identical type that are arranged in an opposite position in the second lateral direction (y) in the two rows is oriented with its shorter dimension a parallel to the contact strip 11, while the other semiconductor memory chip of these two semiconductor memory chips is oriented with its longer dimension b parallel to the contact strip 11. Therefore, maximizing the utilization of the space available on the electronic printed circuit board 2 can be achieved.

In the exemplary embodiments shown, the larger dimension b of the semiconductor memory chips of identical type is dimensioned with a magnitude such that a symmetrical arrangement of semiconductor memory chips 3 situated oppositely in the second lateral direction (y), in the case of which the shorter dimension of the semiconductor memory chips 3 is in each case parallel to the contact strip 11, is not possible. In this respect, the arrangement of the rectangular semiconductor memory chips according to the invention only enables an arrangement of the semiconductor memory chips in two rows situated opposite one another in the second lateral direction (y).

In other words, the semiconductor memory chips of identical type each have a larger dimension b and a shorter dimension a. In order to maintain a symmetrical arrangement of the memory chips and to minimize the size of the PC board required, the memory chips are arranged in two rows and are situated such that the longer dimensions b of each memory chip are placed facing a shorter dimension a of each adjacent memory chip.

In FIGS. 2 and 3, in each case five semiconductor memory chips are arranged next to one another in the upper rows between the center of the electronic printed circuit board 2 and the respective second edge 9, while four semiconductor memory chips are arranged next to one another in the lower rows between the center of the electronic printed circuit board 2 and the respective second edge 9. Viewed between the center of the electronic printed circuit board 2 and a second edge 9 thereof, only eight semiconductor memory chips of the upper and lower rows serve for data storage, while one semiconductor chip to the left and right of the center of the electronic printed circuit board serves as an error correction chip (ECC). In FIGS. 2 and 3, the semiconductor memory chips 3 are arranged symmetrically with respect to the center of the electronic printed circuit board 2.

In the plan view of FIG. 4, ten semiconductor memory chips 3 of identical type are arranged on an external area to the left of the center of the electronic printed circuit board 2, while eight semiconductor memory chips 3 of identical type are arranged on an external area to the right of the center. The semiconductor memory chips identified by "ECC" on the left-hand side each serve as an error correction chip. Consequently, the embodiment of the memory module according to the invention in FIG. 4 is not constructed symmetrically with respect to its center.

Altogether, thirty six semiconductor memory chips are mounted on the external areas of the front and rear sides of the memory modules illustrated in FIGS. 2 to 4. In the embodiments of FIGS. 2 and 3, respective terminations 7 for the line bus, in particular control and address bus, are arranged adjacent to the semiconductor memory chips of the lower rows.

The embodiments of the memory module according to the invention as shown in FIGS. 2 and 3 differ in that the terminations 7 for the line bus in the embodiment shown in FIG. 2 are arranged in the lower row in each case near to the second edges 9 of the electronic printed circuit board 2. Meanwhile, the terminations 7 for the line bus in the embodiment shown in FIG. 3 are arranged in the lower row near to the center of the electronic printed circuit board 2. The embodiment of the memory module according to the invention that is shown in FIG. 4 differs from the embodiments of FIGS. 2 and 3 by virtue of the asymmetrical arrangement of the semiconductor memory chips, set forth above, and the positioning of the terminations 7, which are arranged next to the semiconductor memory chips of the upper rows and above the register component 5.

A line bus, in particular a control and address bus, which is not illustrated in FIGS. 2 to 4 enters into the register component 5 from outside and makes contact with each semiconductor memory chip 3 until it leads into the terminations 7. The embodiments shown enable various possibilities for the wiring (line bus) of the semiconductor memory chips of identical type that are mounted thereon and is explained in more detail with reference to FIGS. 5 to 7.

Figure 5:
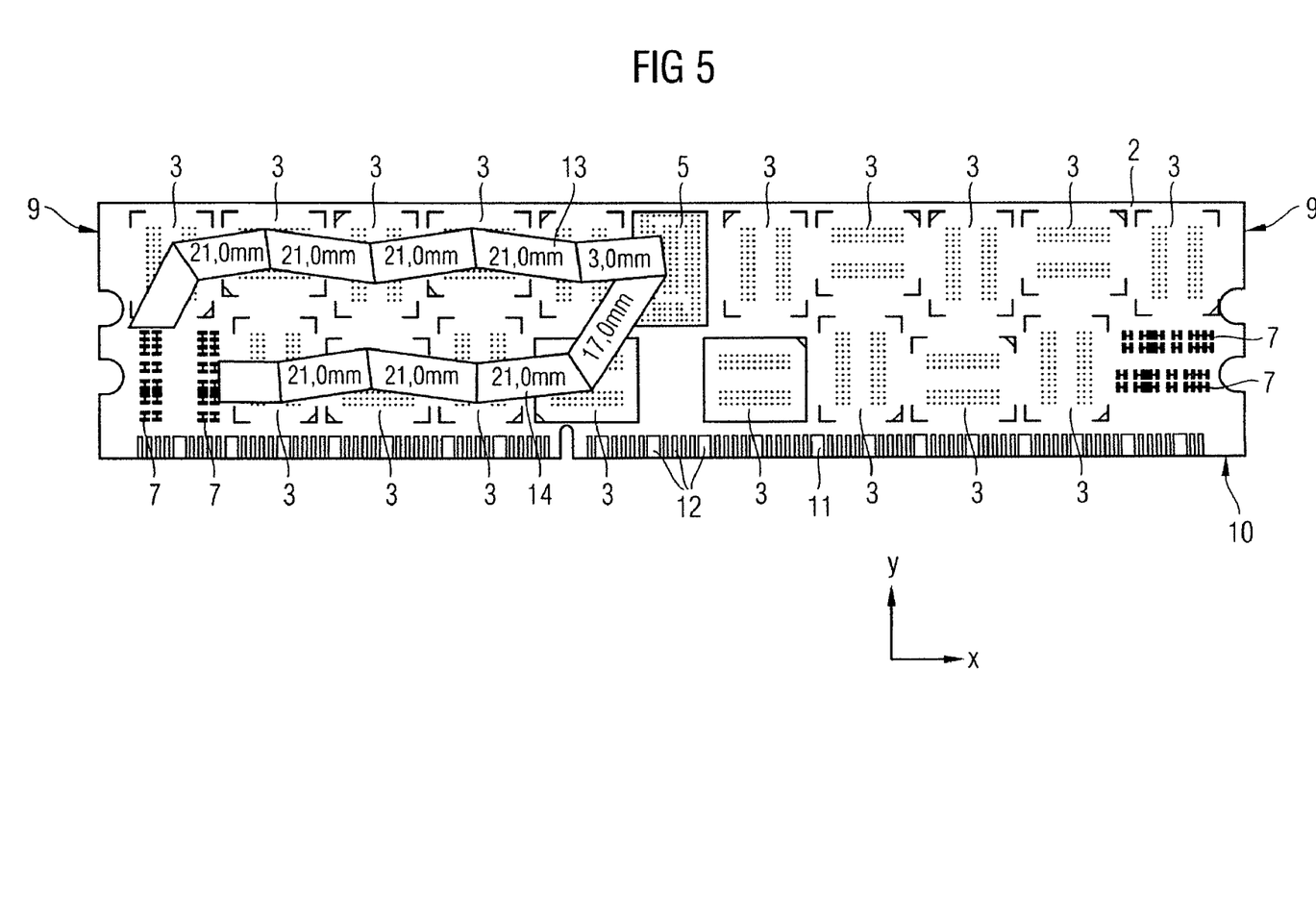
FIG. 5 shows a schematic plan view of the embodiment of the memory module according to the invention that is shown in FIG. 2, with schematic illustration of one configuration of the line bus.
Figure 6:
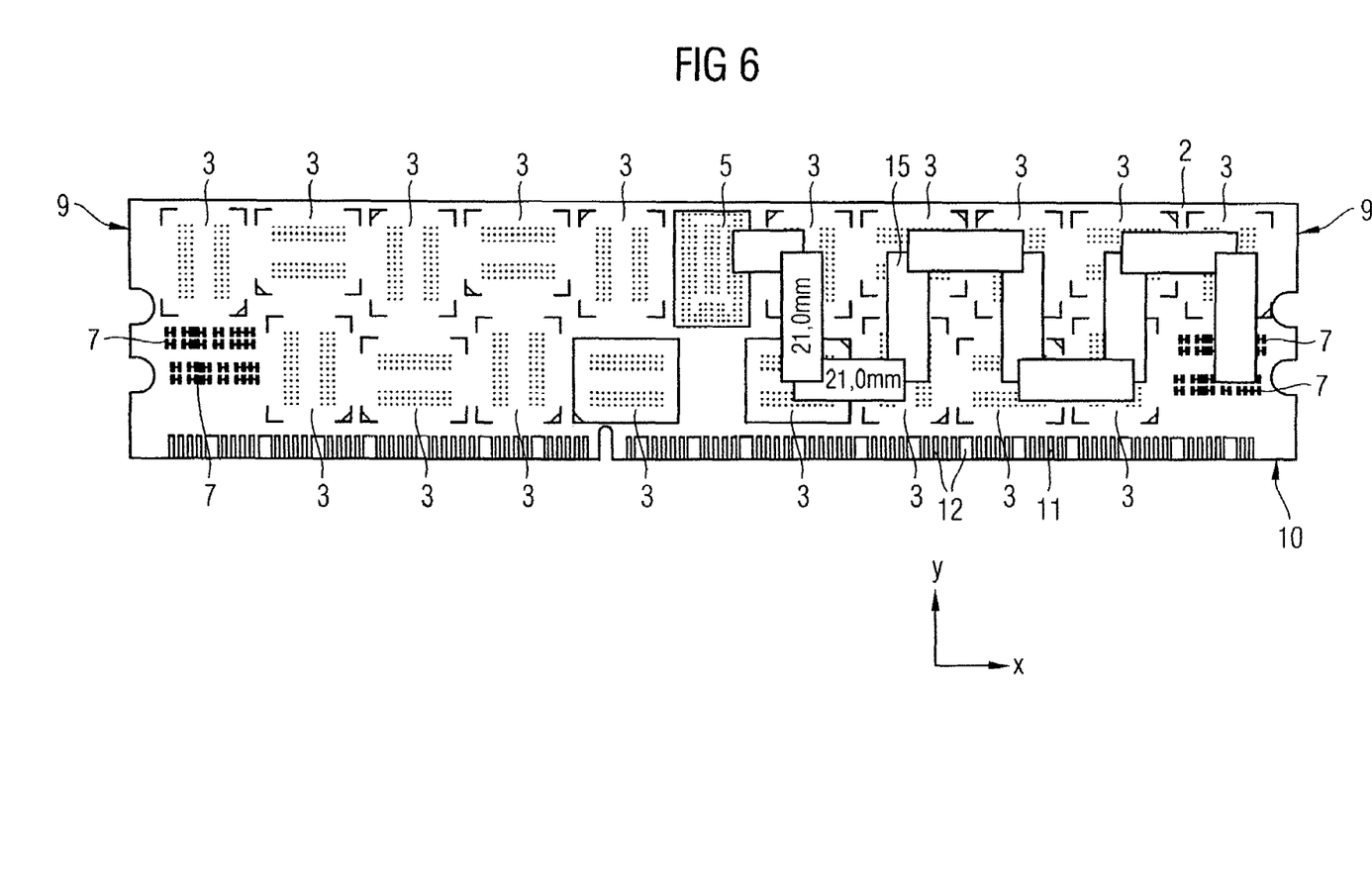
FIG. 6 shows a schematic plan view of the embodiment of the memory module according to the invention that is shown in FIG. 2, with schematic illustration of a further configuration of the line bus.
Figure 7:
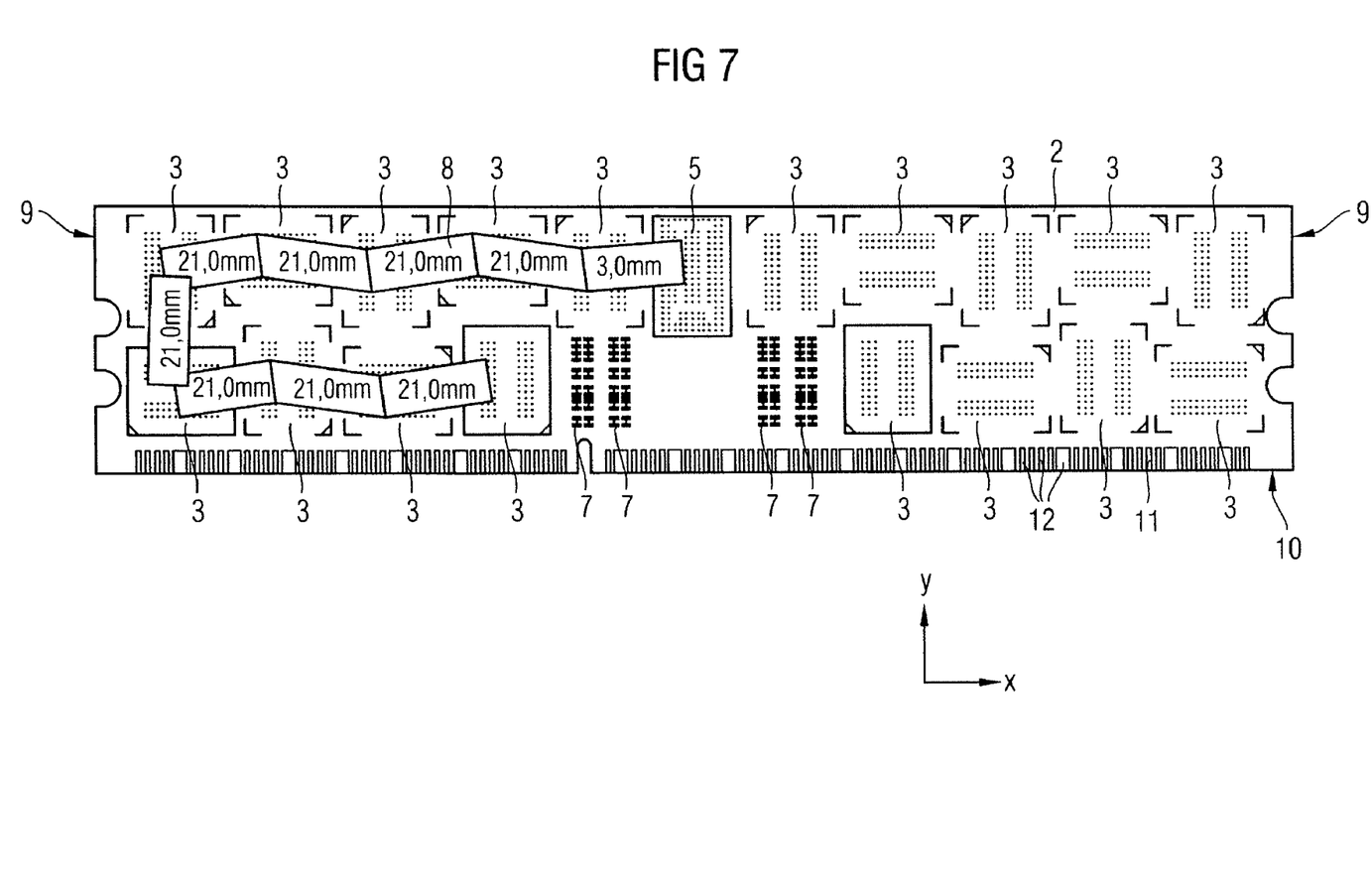
FIG. 7 shows a schematic plan view of the embodiment of the memory Module according to the invention that is shown in FIG. 3, with schematic illustration of a further configuration of the line bus.

FIGS. 5 and 6 illustrate a schematic plan view of the embodiment of the memory module according to the invention that is shown in FIG. 2, with a schematic illustration of one configuration of the line bus. Meanwhile, FIG. 7 illustrates a schematic plan view of the embodiment of the memory module according to the invention that is shown in FIG. 3, with a schematic illustration of one configuration of the line bus.

In order to avoid unnecessary repetition, only the line buses are described in the forthcoming details. With regard to the other features of the memory modules, reference is made to the explanations given regarding the respective FIGS. 2 and 3.

The line bus, in particular control and address bus, shown in FIG. 5 enters into the register component 5 from outside and makes contact with each semiconductor memory chip 3 until it leads into the terminations 7. With regard to the semiconductor memory chips arranged between the center of the electronic printed circuit board 2 and the respective second edges 9, the line bus branches into a branch 13, the upper branch in FIG. 5, and a branch 14, the lower branch in FIG. 5. In this case, the semiconductor memory chips of the upper row are connected to the upper branch 13 and the semiconductor memory chips of the lower row are connected to the lower branch 14. Each branch 13, 14 leads independently into a termination 7. Such a wiring has the advantage that conductor track lengths that are identical in length and comparatively short can be obtained between the semiconductor memory chips 3. In the example shown, the conductor track length between adjacent semiconductor memory chips is 21.0 mm. Moreover, the conductor track length between the register component 5 and the adjacent semiconductor memory chips is comparatively short, e.g., 3.0 mm to the semiconductor memory chip of the upper row and, e.g., 17.0 mm to the semiconductor memory chip of the lower row.

The line bus 15, in particular a control and address bus, shown in FIG. 6 enters into the register component 5 from outside and makes contact with each semiconductor memory chip 3 until it leads into the terminations 7. In this case, the semiconductor memory chips of identical type that are mounted on the external area of the electrical printed circuit board 2 between the center of the printed circuit board 2 and the respective second edge 9 are connected such that the semiconductor memory chips that are situated oppositely in the second lateral direction (y) and the semiconductor memory chips that are adjacent in a row are connected alternately to the line tracks of the line bus. Conductor track lengths which run parallel to the first lateral direction (x) and those which run parallel to the second lateral direction (y) in this case, advantageously, have an identical and comparatively short length, e.g., 21.0 mm in the exemplary embodiment shown.

The line bus 8, in particular a control and address bus, shown in FIG. 7 enters into the register component 5 from outside and makes contact with each semiconductor memory chip 3 until it leads into the terminations 7. In this case, the semiconductor memory chips of the upper row, viewed in the second lateral direction (y), of the two adjacent rows of semiconductor memory chips 3 of identical type are connected one after another to the line tracks of the line bus 8 and then the semiconductor memory chips of the lower row of the two adjacent rows are connected one after another to the line tracks of the line bus. Such a wiring has the advantage that conductor track lengths that are identical in length and comparatively short can be obtained between the semiconductor memory chips 3. In the example shown, the conductor track length between adjacent semiconductor memory chips is, e.g., 21.0 mm. Moreover, the conductor track length between the register component 5 and the adjacent semiconductor memory chip may be comparatively short, e.g., 3.0 mm as shown in FIG. 7.

A line bus, such as that illustrated in FIG. 7, may be used for the embodiment of the memory module according to the invention that is shown in FIG. 4. In this case, in contrast to the line bus of FIG. 7, the semiconductor memory chips of the lower row viewed in the second lateral direction (y) of the two adjacent rows of semiconductor memory chips 3 of identical type, are connected one after another to the line tracks of the line bus 8 and then the semiconductor memory chips of the upper row of the two adjacent rows are connected one after another to the line tracks of the line bus.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Semiconductor memory module
2 Electronic printed circuit board
3 Memory chip
4 Data line
5 Register component
6 Line bus
7 Termination
8 Line bus
9 Second edge
10 First edge
11 Contact strip
12 Contact
13 Upper line bus branch
14 Lower line bus branch
15 Line bus

What is claimed is:
1. A semiconductor memory module, comprising:
an electronic printed circuit board including a contact strip that extends at a first edge of the printed circuit board along a first lateral direction and a plurality of electrical contacts disposed along the first lateral direction between two second edges that extend in a second lateral direction that is perpendicular to the first lateral direction; and
a plurality of semiconductor memory chips of substantially identical type mounted on at least one external area of the printed circuit board and having a rectangular form with a shorter dimension and a longer dimension in a direction perpendicular to the shorter dimension, the memory chips being arranged in at least two rows, each row extending, in the first lateral direction, between a center of the printed circuit board and a respective second edge, wherein the memory chips in each row are arranged in an alternating sequence of opposite orientations with the longer dimension of each memory chip being parallel with the shorter dimension of adjacent memory chips in the same row, and wherein memory chips aligned in the second lateral direction and lying in respective adjacent rows have opposite orientations.

2. The semiconductor memory module according to claim 1, wherein the semiconductor memory chips include at least four semiconductor memory chips that are mounted in a row on the external area of the electrical printed circuit board.

3. The semiconductor memory module according to claim 1, wherein the semiconductor memory chips include nine semiconductor memory chips that are distributed between two rows arranged in a manner lying one adjacent to another in the second lateral direction.

4. The semiconductor memory module according to claim 1, further comprising:
a branching separate line bus comprising a first branch and a second branch;
wherein the memory chips mounted on the external area between the center and the respective second edge of the printed circuit board are connected by the branching separate line bus, such that the memory chips of a first row are connected in a series via line tracks of the first branch of the branching separate line bus, and the memory chips of a second row are connected in a series via line tracks of the second branch of the branch separate line bus.

5. The semiconductor memory module according to claim 1, further comprising:
a separate line bus comprising line tracks;
wherein the memory chips mounted on the external area between the center and the respective second edge of the printed circuit board are connected by the separate line bus, such that the memory chips of a first row are connected in series via the line tracks of the separate line bus and the semiconductor memory chips of an adjacent second row are connected in series via the line tracks of the separate line bus.

6. The semiconductor memory module according to claim 1, further comprising:
a separate line bus comprising line tracks;
wherein the memory chips mounted on the external area between the center and the respective second edge of the printed circuit board are connected by the separate line bus, such that the line tracks of the separate line bus extend in a serpentine path between the center and the respective second edge of the printed circuit board and connect the memory chips of first and second rows in series, with the line tracks alternately connecting adjacent memory chips in the same row and adjacent memory chips in different rows.

7. The semiconductor memory module as claimed in claim 1, wherein the semiconductor memory module is standardized in accordance with a Joint Electron Device Engineering Council (JEDEC) Solid State Technology Association Standard.

* * * * *